United States Patent [19]

Ikeda

[11] Patent Number: 5,183,547
[45] Date of Patent: Feb. 2, 1993

[54] SPUTTERING APPARATUS AND SYSTEM FOR SPUTTERING EMPLOYING SAME

[75] Inventor: Jiro Ikeda, Shizuoka, Japan

[73] Assignee: Sony Corporation, Japan

[21] Appl. No.: 684,919

[22] PCT Filed: Sep. 12, 1990

[86] PCT No.: PCT/JP90/01170

§ 371 Date: Apr. 19, 1991

§ 102(e) Date: Apr. 19, 1991

[87] PCT Pub. No.: WO91/04352

PCT Pub. Date: Apr. 4, 1991

[30] Foreign Application Priority Data

Sep. 13, 1989 [JP] Japan .................................. 1-237493
Mar. 30, 1990 [JP] Japan .................................. 2-83794

[51] Int. Cl.[5] .............................................. C23C 14/56
[52] U.S. Cl. ................................ 204/298.25; 118/730; 414/217; 414/222; 414/225
[58] Field of Search ...................... 204/298.25, 298.35; 118/728-731; 414/217, 222-223, 225

[56] References Cited

U.S. PATENT DOCUMENTS 3,915,117 10/1975 Schertler ............................. 118/719
4,595,483 6/1986 Mahler ............................ 204/298.09
4,820,106 4/1989 Walde et al. ......................... 414/217
4,861,563 8/1989 Shekerjian et al. ............. 422/186.05
4,886,592 12/1989 Anderle et al. ................. 204/298.25

FOREIGN PATENT DOCUMENTS 0291690 11/1988 European Pat. Off. .
2252419 6/1975 France .................................. 118/719
48-79181 10/1973 Japan .............................. 204/298.25

Primary Examiner—Aaron Weisstuch
Attorney, Agent, or Firm—Ronald P. Kananen

[57] ABSTRACT

The present invention provides a sputtering apparatus employed for producing an optical disc, for example, wherein a material to be processed by sputtering, such as a disc base plate, is placed in a vacuum chamber having an opening for entrance and exit of the material and a sputtering station, and is transported between the opening and the sputtering station by a rotary arm or arms, in such a manner as to simplify and reduce the size of the vacuum chamber and increase the production quantity per unit time. The present invention also provides an arrangement in which at least two of the sputtering apparatus are arranged in juxtaposition, and the sputtering operation is performed by one of the apparatus during the time when the sputtering operation is completed and the next sputtering operation is not started in the remaining apparatus, so that the equipment common to the respective sputtering apparatus, such as the sputtering power source, may be used so as to simplify the apparatus and increase the production quantity per unit time.

8 Claims, 16 Drawing Sheets

SPUTTERING APPARATUS AND SYSTEM FOR SPUTTERING EMPLOYING SAME

TECHNICAL FIELD

This invention relates to a sputtering apparatus for sputtering a metal material, such as aluminum, on an optical disc base plate for producing an optical disc, and a sputtering system employing the sputtering apparatus.

BACKGROUND ART

There has been proposed an optical disc for recording or reproducing predetermined information signals, such as audio or video signals. The optical disc is constituted by a disc base plate formed of, for example, polycarbonate or acrylic resin and on which pits and grooves are formed, and a metal material, such as aluminum, deposited thereon as a reflective film.

Among the techniques of depositing the metal material on the disc base plate, an evaporation method, an ion plating method, and a sputtering method are known.

The evaporation method consists in heating a metal material, acting as an evaporation source, in a vacuum chamber for evaporating the metal and depositing the metal material on the disc base plate placed in the so-produced metal vapor. Since the processing cannot be started with this method until the metal material is vaporized sufficiently, a so-called batch system is employed for increasing the quantity of the optical discs produced for a unit time, according to which plural optical discs are produced by one evaporating operation of the metal material with the use of a large-sized vacuum chamber capable of accommodating plural optical discs. Thus the apparatus is complicated in structure and increased in size so that restrictions are imposed on the floor space. In addition, since continuous operation cannot be performed, it is difficult to shorten the processing time to increase the production efficiency significantly.

Similarly to the evaporation method, the ion plating method consists in vaporizing and ionizing the metal material in a vacuum chamber containing a gas for electrical discharge, such as argon, under a reduced pressure, and applying an electrical field thereto for accelerating the ionized gas and the ionized metal vapor toward the disc base plate for depositing the metal material on the disc base plate. With this ion plating method, similarly to the above described evaporation method, the metal vaporizing operation is time-consuming, so that the batch system needs to be employed for increasing the production quantity of the optical discs per unit time. Hence, it is difficult to reduce the size of the processing apparatus or to shorten the processing time.

The sputtering method has advantages that the processing can be completed in a short time, a continuous processing is possible, and the films can be formed on the optical discs under the same conditions, so that the method is suited to mass production or to production of a number of different types of the disc base plates.

The sputtering method consists in sealing a gas for electrical discharge, such as argon, under a reduced pressure, in a vacuum chamber containing a disc base plate and a metal material, such as aluminum acting as a target, and applying an electrical field to said vacuum chamber for ionizing the gas. The thus-ionized gas bombards the metal material, thereby ejecting atoms or molecules of the metal material, so as to be deposited as a thin film on the disc base plate.

Among the known apparatus for performing the sputtering operation is a so-called load-lock type sputtering apparatus shown for example in FIG. 26. This sputtering apparatus includes a vacuum vessel 10i and a sputtering station 102 provided above the middle portion of the vacuum vessel 101. An inlet 101a by means of which a disc base plate 103 is introduced into the vessel 101 and an outlet 101b by means of which the disc base plate 103 is transported out of the vessel 101 are provided at the opposite sides of the vessel 101.

This sputtering apparatus also includes a transport device 104 for transporting disc base plates. The transport apparatus 104 is adapted for transporting the disc base plates 103 from outside of the vacuum vessel 101 into the vacuum vessel 101 by means of the inlet 101a and transporting the disc base plates 103 out of the vacuum vessel 101 by way of the sputtering station 102 and the outlet 101b.

A plurality of opening/closure valves 105 are provided within the vacuum vessel 101. These opening/closure valves 105 are adapted for subdividing the inside of the vacuum vessel 101 into a plurality of hermetically sealed cells or chambers along the transport direction of the disc base plates 103. These opening/closure valves 105 are adapted for maintaining the portions of the vacuum vessel 101 associated with the sputtering station 102 in a high vacuum state and are opened or closed with the progress in the transport operation of the disc base plate 103. In this manner, the chambers of the vacuum vessel 101 are maintained at a predetermined pressure. That is, the portions of the vacuum vessel 101 adjacent to the inlet 101a and the outlet 101b are at a lower vacuum, while the middle sputtering station 102 is at the highest vacuum.

Within the sputtering station 102, a target made of a metallic material 106 to be applied to the disc base plate s arranged, and a gas for electrical discharging is present therein under a high vacuum state. An electrical field application apparatus, not shown, for applying an electrical field, is provided in the sputtering station 102.

With the above sputtering apparatus, the disc base plate 103 is transported from the inlet 101a into the inside of the vacuum vessel 101 as far as the position of the sputtering station 102 maintained at the highest vacuum. The above mentioned sputtering operation is performed at this position so that a thin metal film is deposited on the disc base plate 103. This sputtering operation is completed within, for example, two to three seconds. The optical disc, on which the thin film has been formed, is transported to the portions of the vessel 101 maintained at progressively lower vacuums and discharged out of the vacuum vessel 101 by way of the outlet 101b.

Among the apparatus so far known for performing the sputtering operation on the disc base plates 103 is a apparatus shown in FIGS. 27 and 28. The sputtering apparatus shown in FIGS. 27 and 28 is provided with a transport table 108 which is rotatably supported in a cylindrical vacuum chamber 107 by a supporting shaft 108a and on which are supported a plurality of disc base plates 103. A circular disc inlet/outlet 107a having a diameter slightly larger than the outside diameter of the disc base plate 103 is provided above the upper surface of the vacuum vessel 107, while there is also provided a sputtering station 102, similar to the above described sputtering apparatus, at a position substantially facing the disc inlet/outlet 107a.

The transport table 108 is rotated in a direction shown by an arrow r in FIGS. 27 and 28 about the supporting shaft 108a as the center of rotation, whereby the disc base plate 103 introduced into the vacuum chamber 107 by way of the disc inlet/outlet 107a is transported to a position facing the sputtering station 102. The transport table 108 is transiently kept at a standstill at the position facing the sputtering station 102. While the transport table is at a standstill, the sputtering operation is performed on the disc base plate 103. After the end of the sputtering operation, the transport table 108 is again rotated in a controlled manner for transporting the disc base plate 103 to the position facing the disc inlet/outlet 107a.

The disc base plate 103 is placed on a disc supporting table 108b fitted into a recess formed on the transport table 108. A lid 111 for maintaining the vacuum chamber 107 in a vacuum is provided at the disc inlet/outlet 107a.

With the above described sputtering apparatus, the disc inlet/outlet 107a is kept closed by at least one of the disc supporting table 108b or the lid 111 by the operation of thrust shafts 109, 110 projecting from the bottom surface into the interior of the vacuum chamber 107. In this manner, the disc base plate 103 may be transported into and out of the vacuum chamber 107 under a state in which atmospheric air is prevented from intruding into the inside of the vacuum chamber 107.

It is noted that, with the sputtering apparatus shown in FIG. 26, even if the time necessary for the sputtering operation itself could be reduced, the time necessary for the sputtering operation itself could be reduced, the time necessary for the transport operation of the disc base plate 103 into and out of the sputtering apparatus is s long that it is difficult to reduce the residence time in the apparatus. On the other hand, if the residence time is long as compared with the sputtering time, a large number of disc base plates are caused to dwell in the apparatus thus increasing the size of the apparatus and the floor area. In addition, since the vacuum vessel 101 is increased in space, a larger exhaust pump needs to be used in order to maintain a sufficiently low vacuum in the vacuum vessel to guarantee satisfactory sputtering, with the result that the apparatus is necessarily increased in size.

Besides, in the above-described sputtering apparatus, since a plurality of opening/closure valves are used for maintaining the state of vacuum within the vacuum vessel, the apparatus is complicated in structure and hence becomes more difficult to produce, while the maintenance of the apparatus becomes more troublesome due to lowered durability of valves or the like devices. For example, the above mentioned opening/closure valves need to be replaced after 100,000 repetitions of the opening/closing operations.

The sputtering apparatus shown in FIGS. 27 and 28 is also inconvenient in that, similarly to the sputtering apparatus shown in FIG. 26, the time necessary in transporting the disc into and out of the apparatus cannot be reduced without considerable difficulties and the apparatus cannot be reduced in size, while the production costs of the apparatus cannot be lowered.

The present invention has been proposed in view of the above described status of the art, and is aimed at providing a sputtering apparatus which is small in size, simplified in structure, easy in production and maintenance and excellent in production efficiency and with which the production quantity per unit time can be expected to be increased significantly.

The present invention also aims at providing a processing system in which equipment common to the sputtering apparatus, such as a sputtering power source unit, can be used to reduce the costs of the apparatus, and in which the production quantity per unit time can be expected to be increased significantly to increase production efficiency.

SUMMARY OF THE INVENTION

The sputtering apparatus according to the present invention includes a vacuum chamber having an opening for entrance and exit of a workpiece to be processed by sputtering, and a processing section including a sputtering station, at least one rotary arm provided in said vacuum chamber and including a rest on the free end of the rotary arm, the rest being adapted for supporting the workpiece, and transfer means for transferring the workpiece between said opening and said processing station by the rotary movement of said rotary arm.

The sputtering system according to the present invention comprises at least two of the above mentioned sputtering apparatus placed in juxtaposition, wherein, when a sputtering operation is completed and the next sputtering operation is not started in one of the sputtering apparatus, a sputtering operation is performed in the other sputtering apparatus.

With the sputtering apparatus of the present invention, the material to be processed by sputtering is placed on a rest at the free end of the rotary arm provided in the vacuum chamber, and is transported between the opening in the vacuum chamber and the sputtering station. Thus the number of the disc base plates residing in the vacuum chamber corresponds to that of the rotary arms. That is, when only one rotary arm is provided, only one disc base plate is present in the chamber, thereby significantly shortening the residence time of the disc base plate in the vacuum chamber. On the other hand, the size of the vacuum chamber corresponding to the rotational range of the rotary arm suffices, thereby reducing the size of the apparatus.

With the sputtering system according to the present invention, at least two sputtering apparatus are placed in juxtaposition and, when a sputtering operation is completed and the next sputtering operation is not started in one of the sputtering apparatus, a sputtering operation is performed in the other sputtering apparatus, so that it cannot occur that the two sputtering apparatus perform the sputtering operation simultaneously. Thus the sputtering operation is performed in one of the apparatus during the idle time of the other apparatus when the sputtering operation is not performed. Thus the equipment common to the apparatus such as a sputtering power source or a vacuum meter, may be employed to increase the production quantity per unit time.

DETAILED DESCRIPTION OF THE PREFERRED EMBODIMENTS

Figure 1:
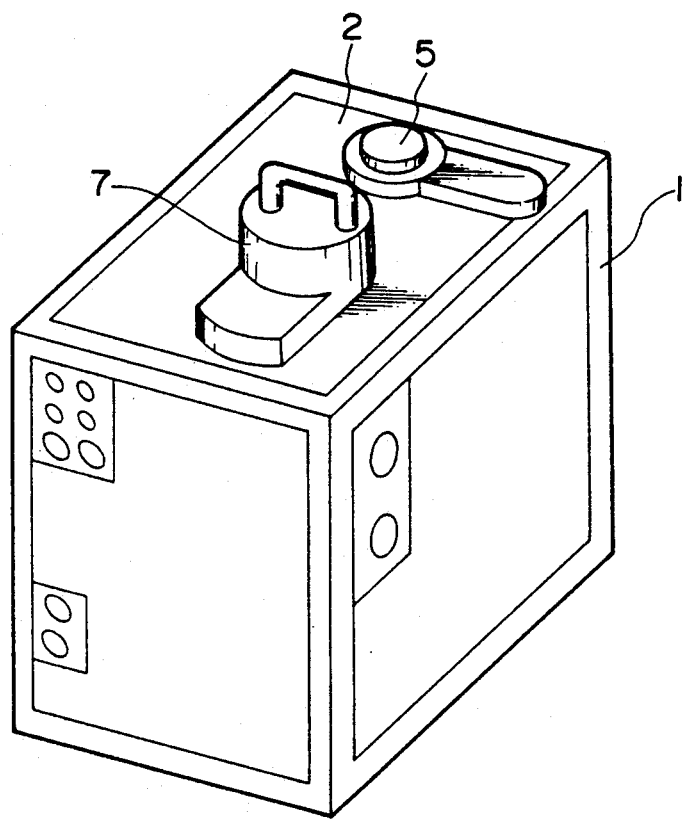
FIG. 1 is a perspective view showing an optical disc producing apparatus to which the sputtering apparatus according to the present invention is applied.

By referring to the drawings, illustrative embodiments of the present invention will be explained in detail.

Meanwhile, the present embodiment is an example in which the sputtering apparatus according to the present invention is applied to an apparatus for producing an optical disc by depositing a thin film of aluminum or the like metal on a disc plate of synthetic resin, such as polycarbonate or acrylic resin, by sputtering.

An explanation is first made of an example of an apparatus for producing an optical disc which is provided with a sputtering apparatus in which two rotary arms for transferring the material to be processed between the disc inlet/outlet and the sputtering station are provided at a predetermined distance from each other along the axis of rotation and in which the sputtering operation on a disc base plate is performed continuously by the transfer operation of the rotary arms.

Referring to FIG. 1, the apparatus for producing the optical disc is provided with a rectangular housing 1, within which are accommodated a vacuum chamber 2 and an exhaust system including a vacuum pump, not shown, provided below the vacuum chamber.

Figure 2:
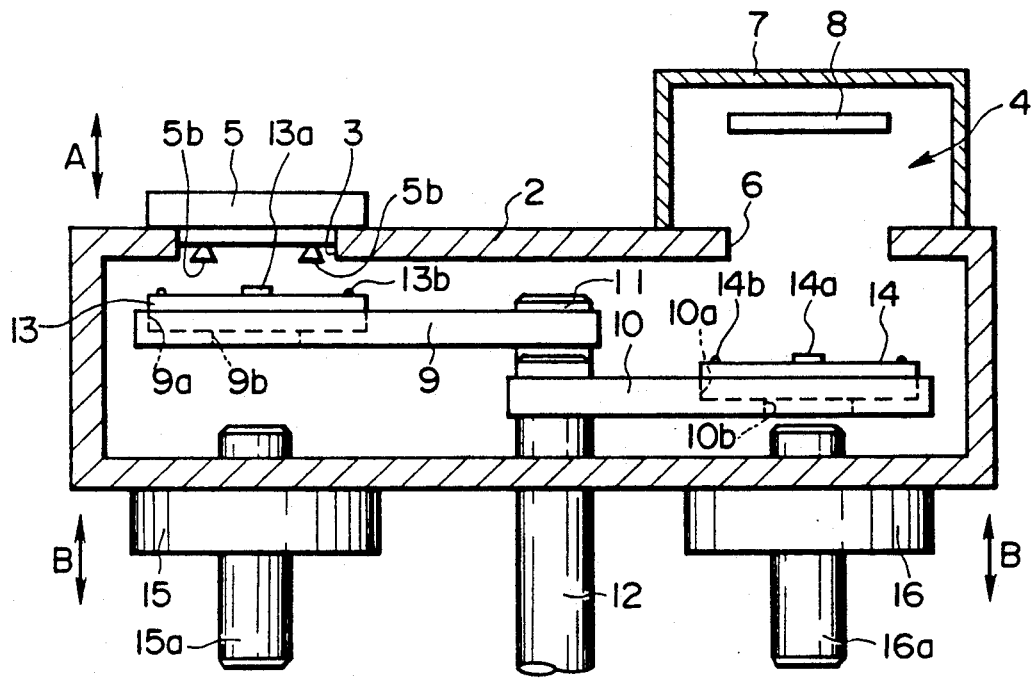
FIG. 2 is a longitudinal sectional view of a vacuum chamber of the optical disc producing apparatus.
Figure 3:
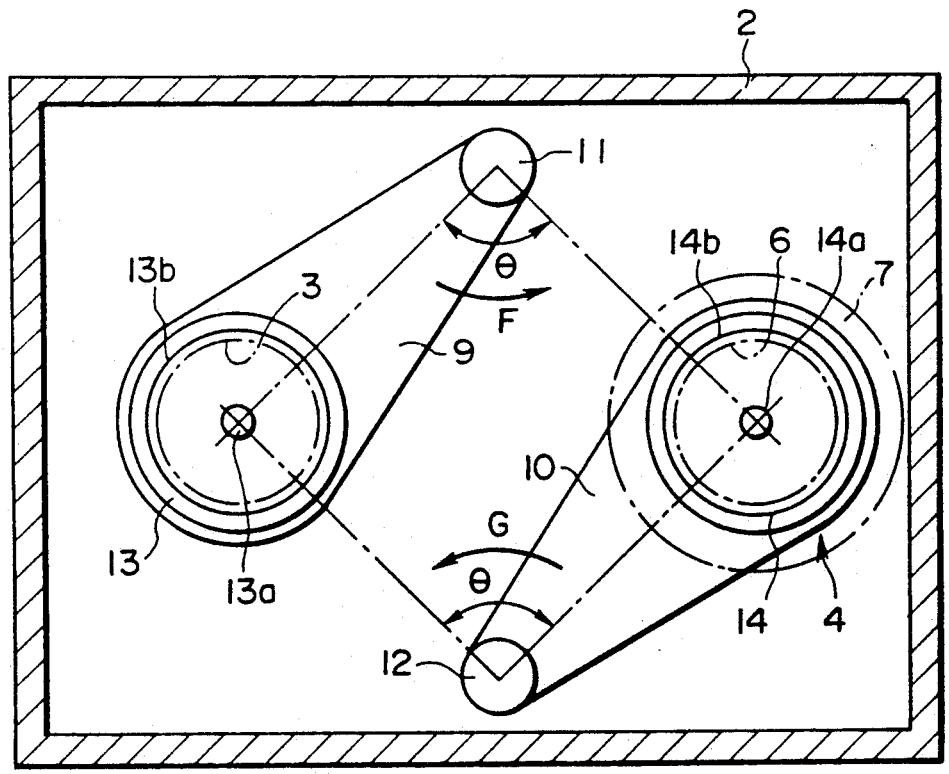
FIG. 3 is a transverse sectional view of the vacuum chamber of FIG. 2.

Referring to FIGS. 2 and 3, the vacuum chamber 2 has its inside maintained at a predetermined degree of vacuum by a vacuum pump. On the upper surface of the vacuum chamber 2, a disc inlet/outlet 3, which is an opening for insertion and discharge of the disc base plate, as the workpiece to be processed by sputtering and the processed disc base plate, and a sputtering station 4 for performing the sputtering operation on the disc base plate, are provided in juxtaposition to each other.

The disc inlet/outlet 3 is in the form of a circular opening which is slightly larger in diameter than the disc base plate 1 inserted or discharged by way of the inlet/outlet 3. A disc-shaped lid 5 for opening or closing the disc inlet/outlet 3 is provided on the disc inlet/outlet 3. As shown by an arrow A in FIG. 2, the lid 5 is supported by a supporting mechanism, not shown, so that the lid may be brought into and out of contact with the vacuum chamber 2. Thus the lid 5 may be moved toward the vacuum chamber 2 into pressure contact with the rim of the opening of the disc inlet/outlet 3 to close the inlet/outlet 3 or may be moved away from the vacuum chamber 2 to open the inlet/outlet 3. Suction pads 5b are mounted on the surface of the lid 5 facing the disc inlet/outlet 3. The disc base plate 1 is drawn by these suction pads 5b so that the disc base plate may be introduced or extracted by means of the disc inlet/outlet 3.

Figure 4:
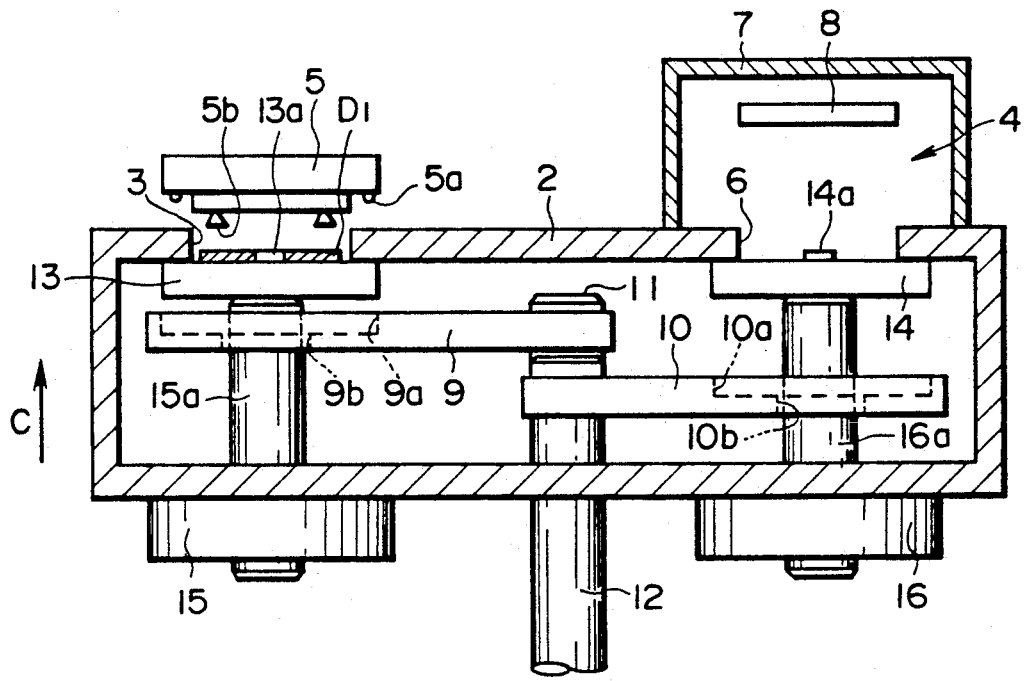
FIG. 4 is a longitudinal sectional view showing the state in which the disc base plate is charged into the vacuum chamber of the optical disc producing apparatus.

As shown in FIG. 4, a sealing member 5a, such as an O-ring, is provided on the rim on the lower surface of the lid 5, so that, when the rim of the lid 5 abuts on the rim of the opening of the disc inlet/outlet 3, an air-tight state may be maintained within the vacuum chamber 2.

The sputtering station 4 is provided with a disc processing opening 6 similar in contour to the disc inlet/outlet opening 3, and a processing section 7 mounted on the vacuum chamber 2 for overlaying the opening 6 and maintaining an air-tight state within the vacuum chamber 2. A metal plate 8, acting as a target and used for sputtering, is accommodated and supported within the processing section 7, which is formed as a cylinder closed at the top. A gas for electrical discharging, such as argon, necessary for sputtering, is used under reduced pressure within the processing section 7, to which a predetermined electrical field is applied.

Within the vacuum chamber 2, there are provided paired first and second rotary arms 9 and 10 constituting transfer means. These rotary arms 9 and 10 are supported at the proximal sides thereof by first and second rotary shafts 11 and 12 so as to be rotated in the horizontal direction substantially normal to the axial direction of the rotary shafts 11 and 12. The rotary shafts 11 and 12 are provided at an equal distance from the disc inlet/outlet 3 and the sputtering station 4 in opposition to each other with the axial direction extending substantially vertically. The rotary shafts 11 and 12 are also provided at an equal distance from the disc inlet/outlet 3 and the sputtering station 4 in opposition to each other with the axial direction extending substantially vertically. The rotary shafts 11 and 12 are also projected downwardly of the vacuum chamber 2 by means of through-holes, not shown, provided on the bottom surface of the vacuum chamber 2, and are rotationally driven at the lower ends thereof by driving devices, not shown, so as to be rotated about their axes together with the rotary arms 9 and 10. The rotary arms 9 and 10 are spaced apart from each other along the axes of the rotary shafts 11 and 12, so that the arms 9 and 10, when rotated separately, do not abut one on the other.

A sealing member, such as an O-ring, is provided between each of the rotary shafts 11 and 12 and each through-hole to maintain the state of vacuum in the vacuum chamber 2.

On the upper surfaces of the free ends or distal sides of the rotary arms 9 and 10, there are formed circular positioning recesses 9a, 10a for supporting the disc plates. Fitted rests 13, 14, adapted for securing the center holes of the disc base plates, are fitted in these recesses 9a, 10a. These rests 13, 14 are formed as discs, each being of a diameter slightly larger than the disc base plate, and are formed with central positioning projections 13a, 14a passed through central chucking openings in the disc base plates. Thus, the disc base plates are fitted into the positioning recesses 9a, 10a and positioned relative to the rotary arms 9 and 10, while the disc base plates are secured to the rests 13, 14. Thrusting shaft inserting apertures 9b, 10b through which the thrusting shafts for thrusting the rests 13 and 14 upwards, are formed centrally in the bottom sections of the positioning recesses 9a, 10a. Thus the middle bottom sections of the rests 13, 14, supported on the rotary arms 9, 10, face toward the lower surfaces of the rotary arms 9, 10 by means of the inserting apertures 9b, 10b. When the rotary arms 9, 10 are rotated by an angle of, for example, 90°, as shown by an arrow 0 in FIG. 3, the rests 13 and 14 are moved between the position below the disc inlet/outlet 3 and the position below the sputtering station 4.

On the bottom sides of the vacuum chamber 2, a pair of thrusting devices 15, 16, each at the inlet/outlet and the processing opening 6, constituting transfer means, are mounted. The thrusting devices 15, 16 support the thrusting shafts 15a, 16a, in substantially an upright position, so that the thrusting shafts 15a, 16a are extended into the inside of the vacuum chamber 2 through-holes, not shown, in the bottom section of the vacuum chamber 2. The thrusting devices 15 and 16 are controlled by control means, not shown, so that the thrusting shafts 15a, 16a are reciprocated vertically as shown by an arrow B in FIG. 2. When the distal sides of the rotary arms 9, 10 face the disc inlet/outlet 3 and the processing opening 6, respectively, the thrusting shafts 15a, 16a are thrusted and protruded by the thrusting devices 15, 16 so as to abut at the distal ends thereof on the bottom sections of the rests 13, 14 by means of the inserting openings 9b, 10b. When the thrusting shafts 15a, 16a are protruded further, the thrusting shafts 15a, 16a shift the rests 13, 14 upwards until the rim of the upper surfaces of the rests 13, 14 abut on and rest against the rim of the opening of the disc inlet/outlet 3 and the disc processing opening 6. Sealing members 13b, 14b, such as the O-rings, are provided on the rim on the upper sides of the rests 13, 14, so that, when the rim on the upper surfaces of the rests abut on the rim of the opening of the disc inlet/outlet 3 and the disc processing opening 6, an air-tight state is maintained within the vacuum chamber 2 and the sputtering station 4.

With the above described apparatus for producing the optical disc, since the disc base plate transfer operation from the disc inlet/outlet 3 and the disc processing opening 6 is performed by the rotary arms 9, 10, each with the small angle of deviation, the size of the vacuum chamber 2 may be correspondingly reduced. Thus the floor space may be reduced, while the capacity of the vacuum chamber 2 may be reduced further. The capacity of the vacuum chamber 2 may be reduced, while the vacuum chamber for exhausting the chamber may be reduced in size and the discharging time may be shortened.

The optical disc is produced by the above described apparatus in the following manner.

First, as shown in FIG. 4, the rests 13, 14 are moved upwards by the thrusting devices 15, 16, as shown by an arrow C therein, so that the disc inlet/outlet 3 and the disc processing opening 6 are closed by the rests 13, 14. The lid 5 is moved away from the vacuum chamber 2 so that the upper side of the first rest 13 faces upwards by means of the disc inlet/outlet 3. The first disc base plate $D_1$ is placed on the first rest 13, and thus is positioned with respect to the rest 13.

Figure 5:
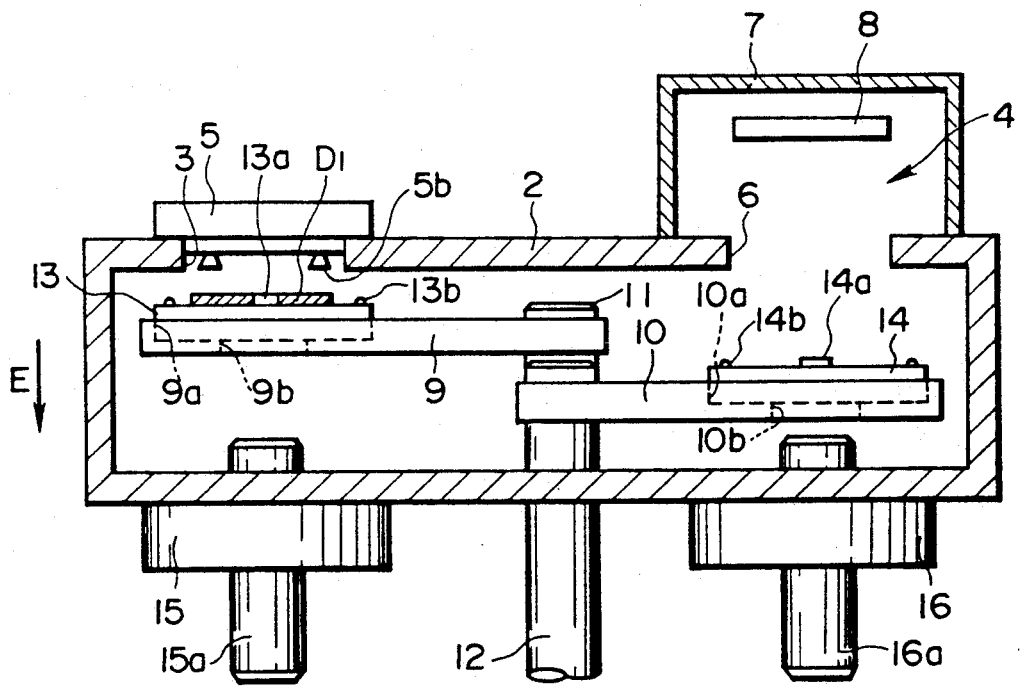
FIG. 5 is a longitudinal sectional view showing the state of completion of charging of the disc base plate into the vacuum chamber of the optical disc producing apparatus.

Then, as shown in FIG. 5, the lid 5 is moved down to close the disc inlet/outlet 3, at the same time that the vacuum pump is actuated to maintain a predetermined vacuum within the vacuum chamber 2.

At this time, since the capacity of the vacuum chamber 2 is small in the present apparatus, the desired vacuum may be reached instantaneously.

The thrusting shafts 15a, 16a are then receded toward the thrusting devices 15, 16, as shown by an arrow E in FIG. 5, until the rests 13, 14 are placed on the distal sides of the rotary arms 9, 10.

Figure 6:
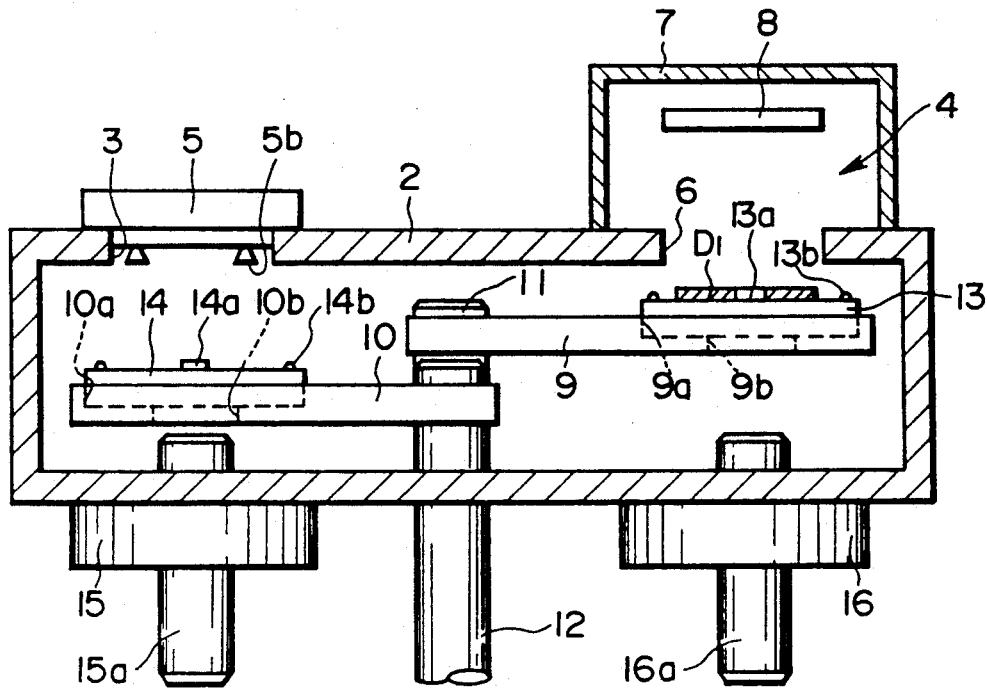
FIG. 6 is a longitudinal sectional view showing the state in which the disc plate has been transported to the sputtering station in the vacuum chamber of the optical disc producing apparatus.

When the rests 13, 14 are placed on the distal sides of the rotary arms 9, 10, these rotary arms 9, 10 are then rotated in the direction of superposition, as shown by arrows F and G in FIG. 3. Then, as shown in FIG. 6, the first disc base plate $D_1$, placed on the first rest 13, is positioned below the disc processing opening 6, while the second rest 14 is positioned below the disc inlet/outlet 3.

Figure 7:
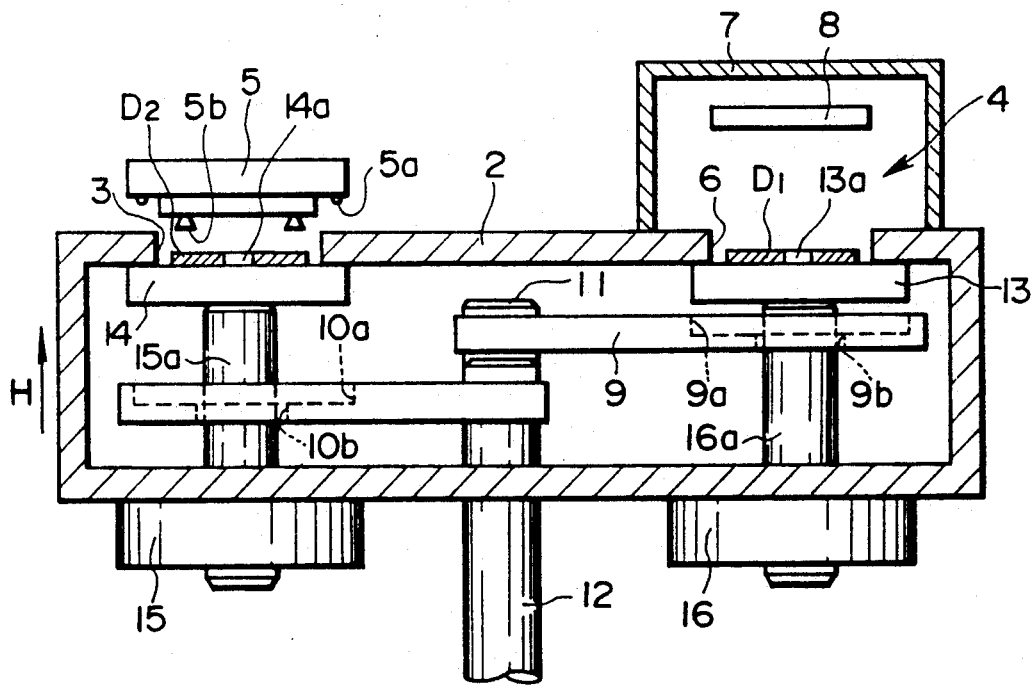
FIG. 7 is a longitudinal sectional view of the vacuum chamber of the optical disc producing apparatus showing the state of processing of the disc base plate by sputtering.

When the rests 13, 14 are positioned at the respectively prescribed positions, the rests 13, 14 are then raised by the thrusting devices 15, 16, as shown by an arrow H in FIG. 7, until the disc processing opening 6 and the disc inlet/outlet 3 are closed by the rests 13, 14, respectively. At this time, the first disc base plate $D_1$ faces the sputtering station 4 by means of the disc processing opening 6.

The sputtering operation for the first disc base plate $D_1$ is now started.

While the sputtering operation is performed on the first disc base plate $D_1$, the lid 5 is moved away from the vacuum chamber 2 until the upper side of the second rest 14 faces the lower side of the disc inlet/outlet 3, and a new second disc plate $D_2$ is placed and positioned on the upper surface of the second rest 14. The disc inlet/outlet 3 is then closed by the lid 5 and the vacuum pump is actuated for maintaining the predetermined vacuum within the vacuum chamber 2. These operations are terminated substantially simultaneously with termination of the sputtering operation on the first disc base plate $D_1$.

Figure 8:
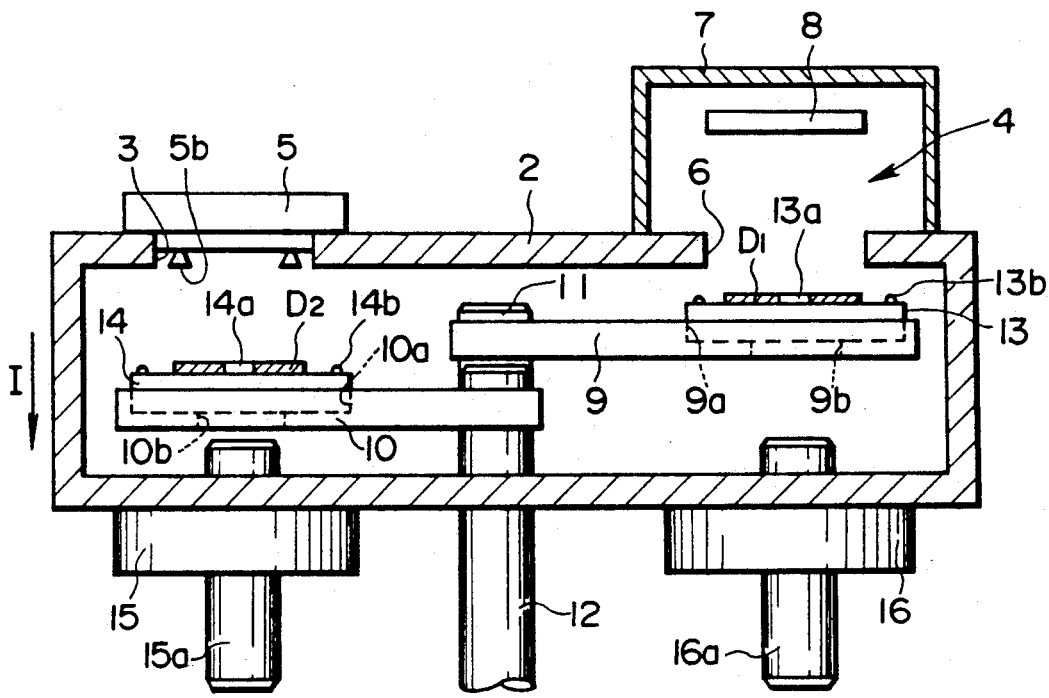
FIG. 8 is a longitudinal sectional view of the vacuum chamber of the optical disc producing apparatus showing the state of completion of sputtering.
Figure 9:
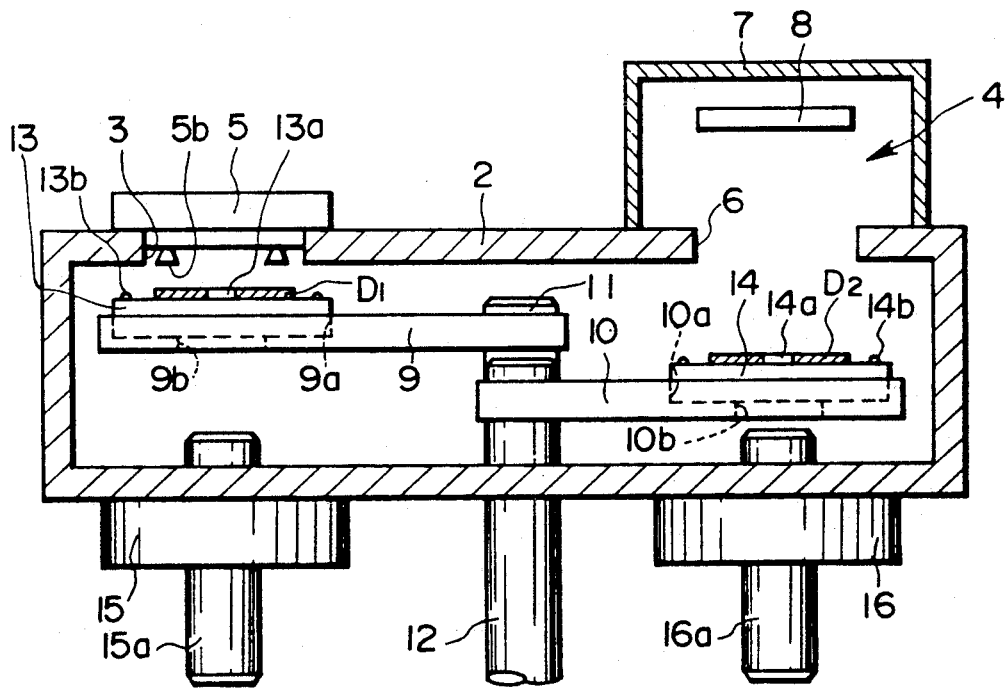
FIG. 9 is a longitudinal sectional view of the vacuum chamber of the optical disc producing apparatus showing the state of completion of disc base plate transfer to the disc inlet/outlet.

When the sputtering operation for the first disc base plate $D_1$ comes to a close, the thrusting shafts 15a, 16a are receded toward the thrusting devices 15, 16, as shown by an arrow I in FIG. 8, for shifting the rests 13, 14 down and placing them on the distal sides of the rotary arms 9, 10.

when the rests 13, 14 are placed on the distal sides of the rotary arms 9, 10, these rotary arms 9, 10 are turned in the direction of superposition (which is opposite to that of the preceding operation). Thus as shown in FIG. 9, the first disc base plate $D_1$, placed on the first rest 13, and on which the thin film of aluminum has been formed, is positioned below the disc inlet/outlet 3, while the second disc base plate $D_2$, placed on the second rest 14, is positioned below the disc processing opening 6.

Figure 10:
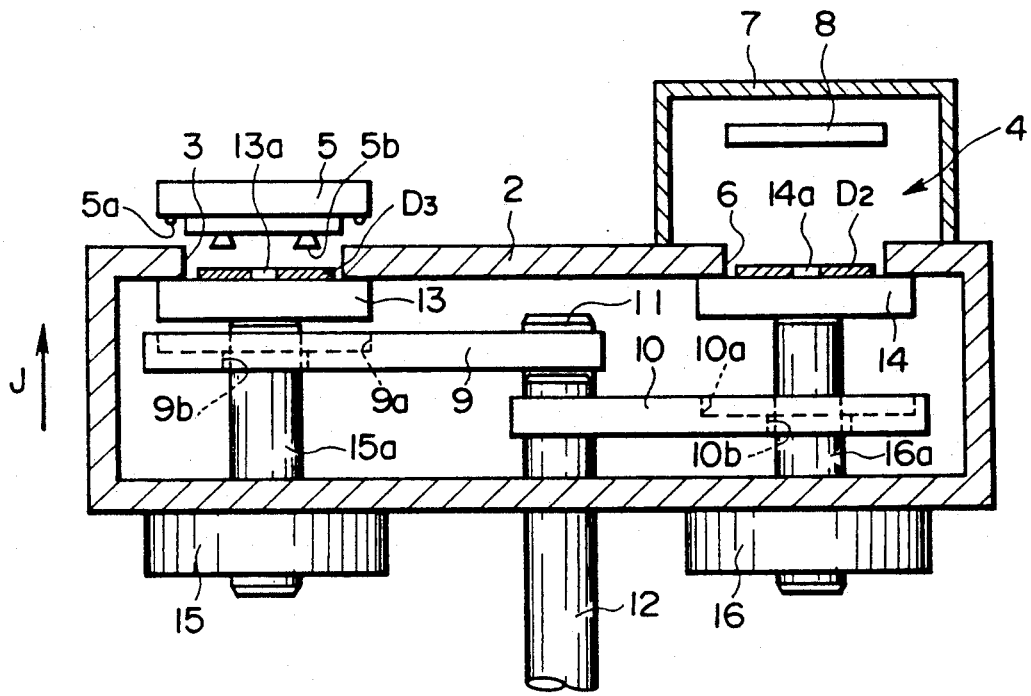
FIG. 10 is a longitudinal sectional view of the vacuum chamber of the optical disc producing apparatus showing the disc base plate takeout state.

When the rests 13, 14 are positioned at the respective predetermined positions, the rests 13, 14 are moved upwards by the thrusting devices 15, 16, as shown by an arrow J in FIG. 10, until the disc inlet/outlet 3 and the disc processing opening 6 are closed by the rests 13, 14. At this time, the second disc base plate $D_2$ faces the sputtering station 4 by means of the disc processing opening 6.

The sputtering operation for the second disc base plate $D_2$ is now initiated.

On the other hand, during the time when the sputtering operation is performed on the second disc base plate $D_2$, the lid 5 is moved away from the vacuum chamber 2, at the disc inlet/outlet side, as explained previously. The first disc base plate $D_1$, placed on the first rest 13 is taken out of the vacuum chamber 2 by means of the disc inlet/outlet 3, while a new third disc base plate $D_3$ is placed and positioned on the upper surface of the first rest 13. The disc inlet/outlet 3 is closed by the cover 5 and the vacuum pump is actuated for maintaining a predetermined degree of vacuum in the vacuum chamber 2. These operations are terminated substantially simultaneously with termination of the sputtering operation for the second disc base plate $D_2$.

Thus the optical disc is produced in only six seconds from the time the disc base plate is introduced into the apparatus until it is taken out after sputtering. In this manner, with the optical disc producing apparatus of the present invention, the production quantity per unit time may be improved with significant increase in production efficiency.

Figure 11:
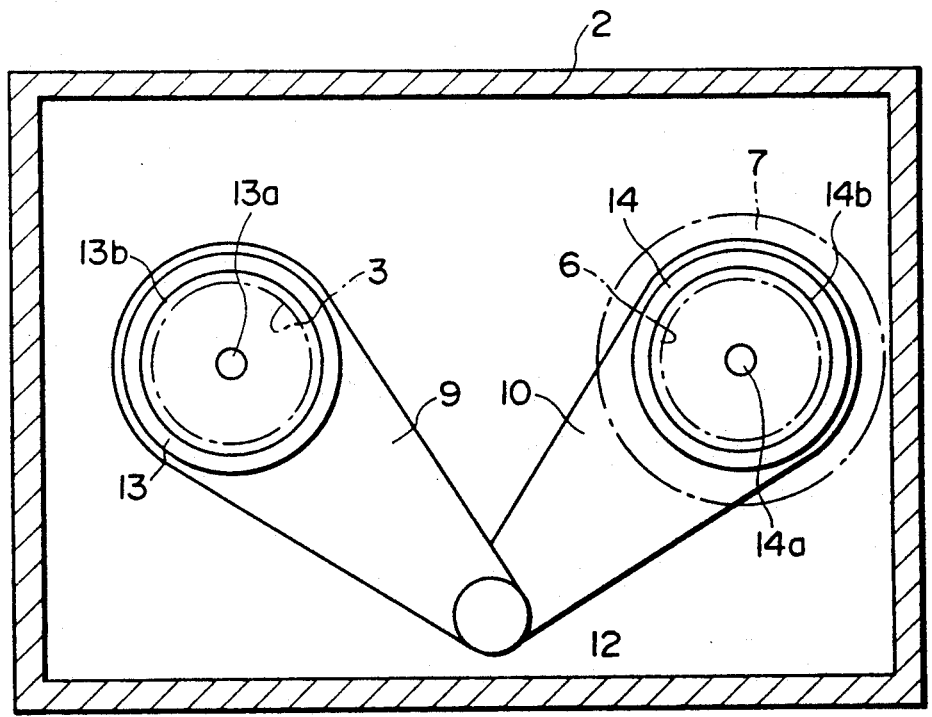
FIG. 11 is a transverse sectional view showing a modification of the vacuum chamber of the optical disc producing apparatus.
Figure 12:
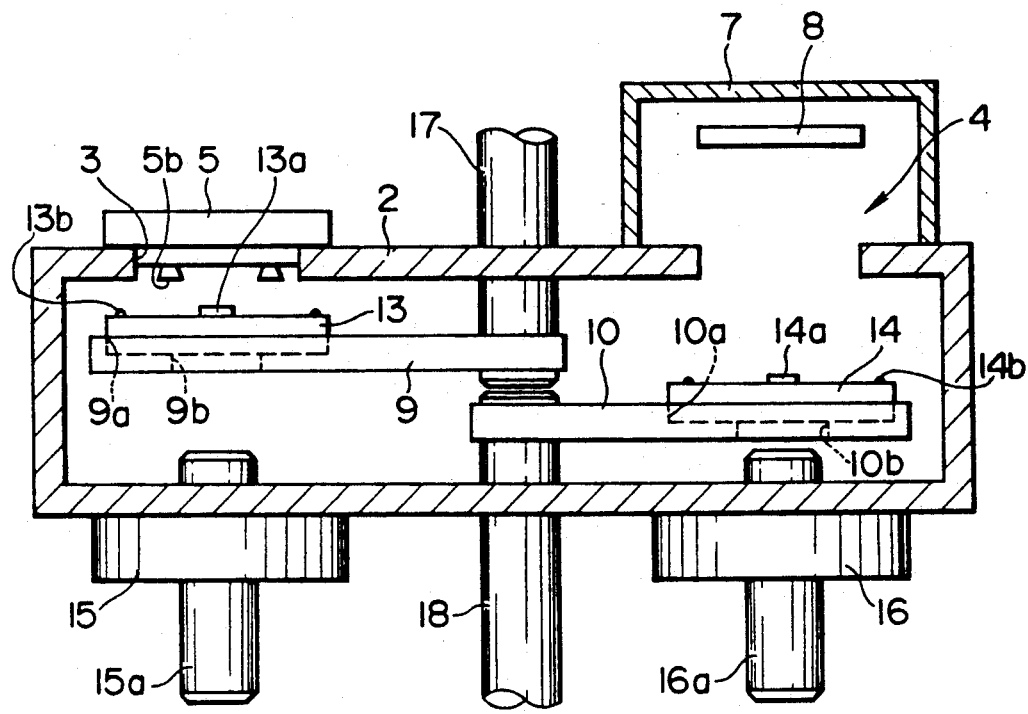
FIG. 12 is a longitudinal sectional view of the vacuum chamber.

With the above described optical disc producing apparatus, the rotary shafts 11, 12 supporting the rotary arms 9, 10 are mounted at a predetermined distance along the axial direction. However, as shown for example in Figs. 11 and 12, the rotary shafts 17, 18 supporting the rotary arms 9, 10 may be provided on the same axis. In this case, one of the rotary shafts 17, 18 supporting the rotary arms 9, 10 is extended towards the lower side of the vacuum chamber 2 and the other is extended towards the upper side of the vacuum chamber 2. With the optical disc producing apparatus of the present embodiment, since two disc base plates are caused to dwell in the vacuum chamber 2, the vacuum chamber may be reduced in size.

Figure 13:
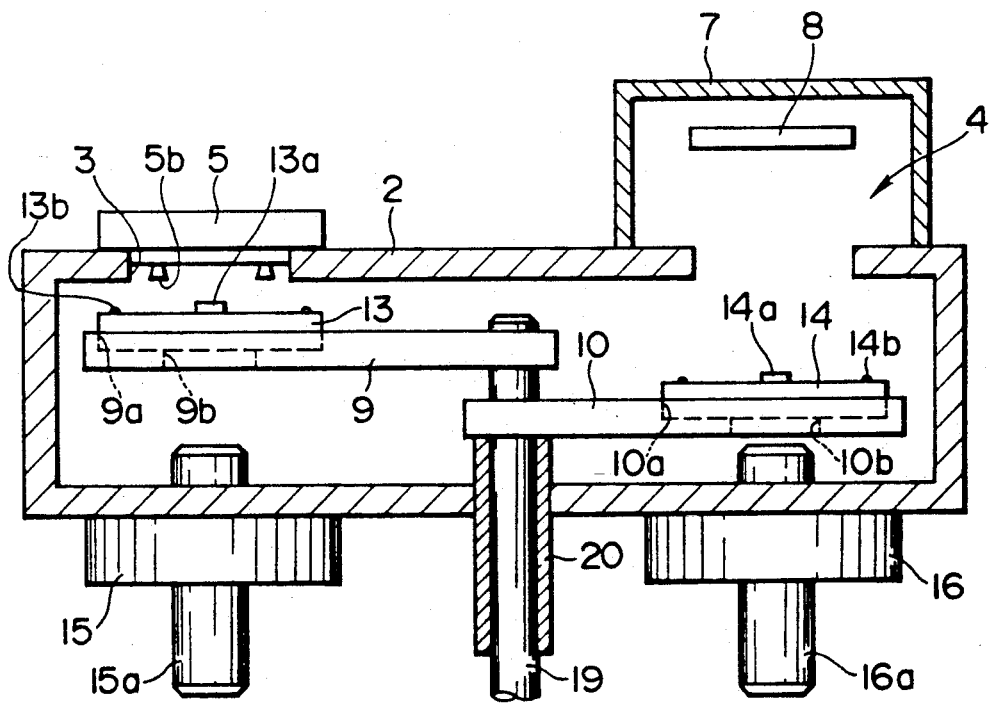
FIG. 13 is a longitudinal sectional view showing a further modification of the vacuum chamber of the optical disc producing apparatus.

Alternatively, as shown in FIG. 13, one of the rotary shafts 19, 20 may be in the form of a hollow cylinder into the hollow section of which is fitted the other of the rotary shafts 19, 20. With the optical disc apparatus of the present embodiment, the vacuum chamber 2 may be reduced in size, as in the preceding embodiment.

Another embodiment of the optical disc producing apparatus, in which only one rotary arm is used for transferring the material to be processed between the disc inlet/outlet 3 and the sputtering station 4 and in which the sputtering operation is repeatedly performed on the disc base plate by the transfer operation of the rotary arm, is hereinafter explained.

In the present embodiment, the same components as those of the above described optical disc producing apparatus are indicated by the same numerals and the corresponding description is omitted for simplicity.

Figure 14:
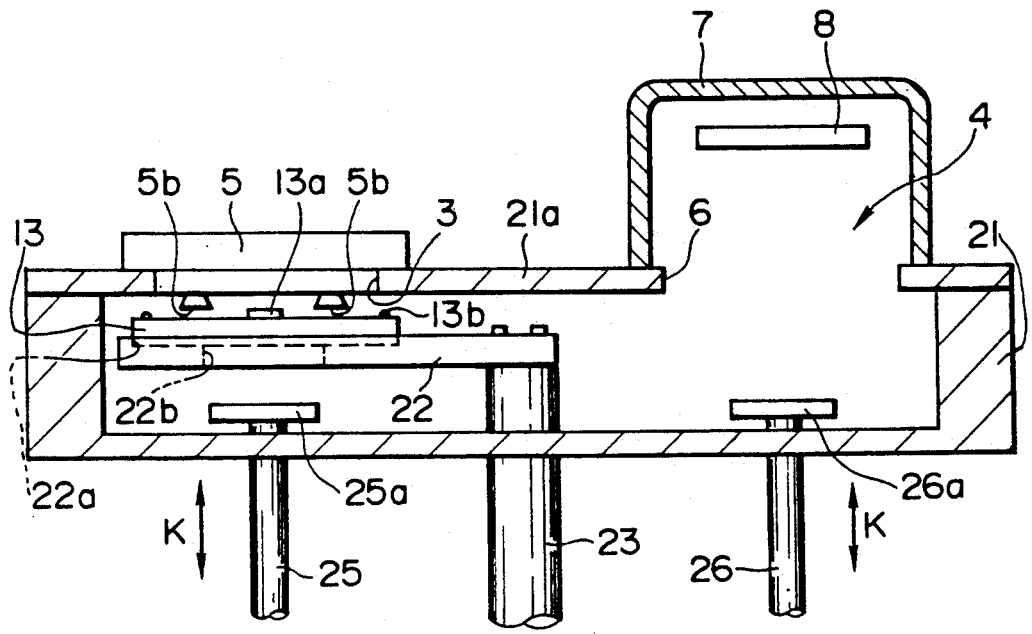
FIG. 14 is a longitudinal sectional view of the vacuum chamber showing a modification of the optical disc producing apparatus and FIG. 15 is a transverse sectional view of the vacuum chamber.
Figure 15:
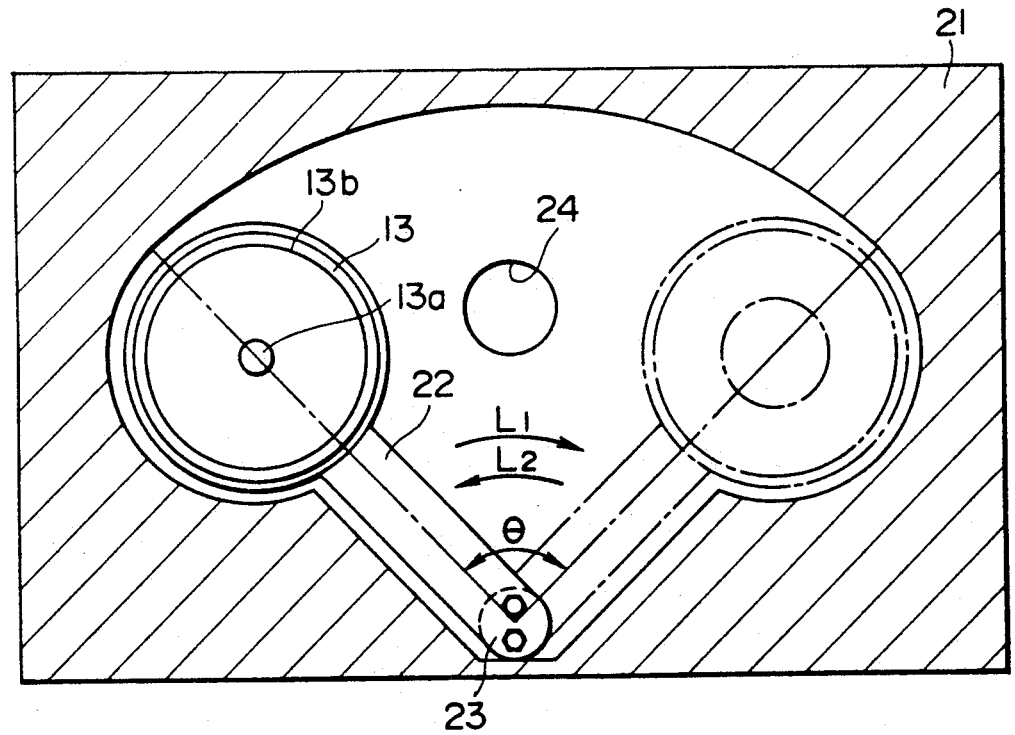

In the optical disc producing apparatus of the present embodiment, as shown in FIGS. 14 and 15, only one rotary arm 22 for transferring the disc base plate between the disc inlet/outlet 3 and the sputtering station within the inside of the vacuum chamber 21 is provided and has its proximal end bolted to the distal end of a rotary shaft 23 protruded into the inside of the vacuum chamber 21, so that the arm may be rotated with rotation of the shaft 23 about it axis.

Figure 27:
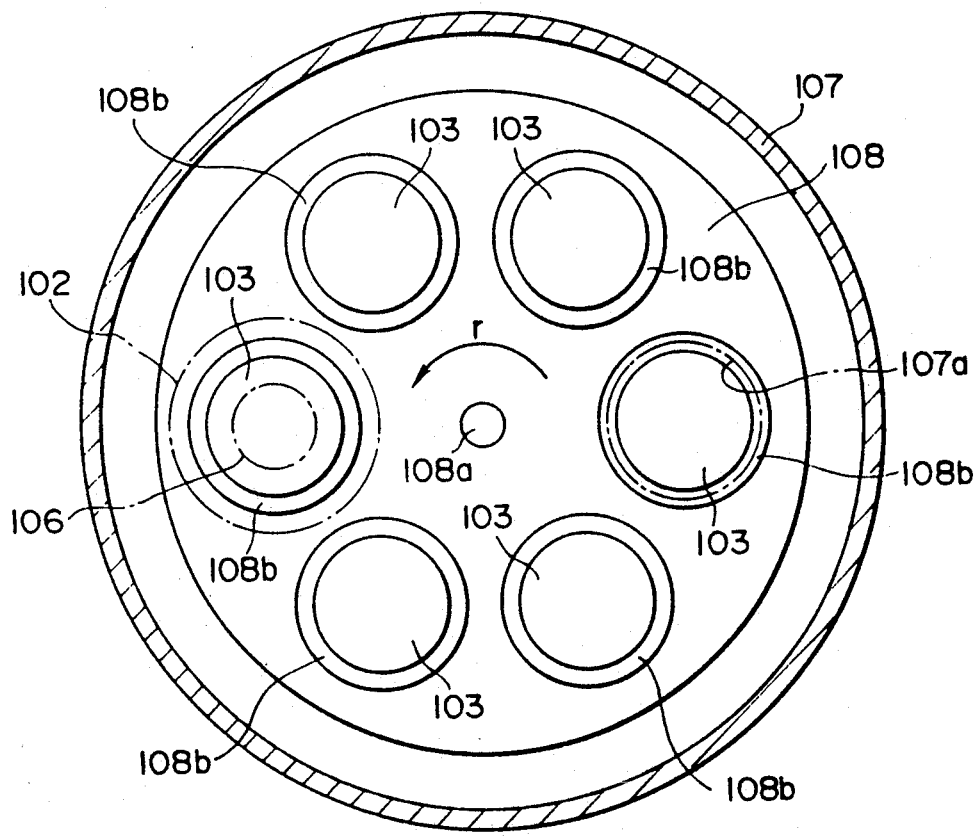
FIG. 27 is a transverse sectional view showing another conventional sputtering apparatus and FIG. 28 is a longitudinal sectional view thereof.
Figure 28:
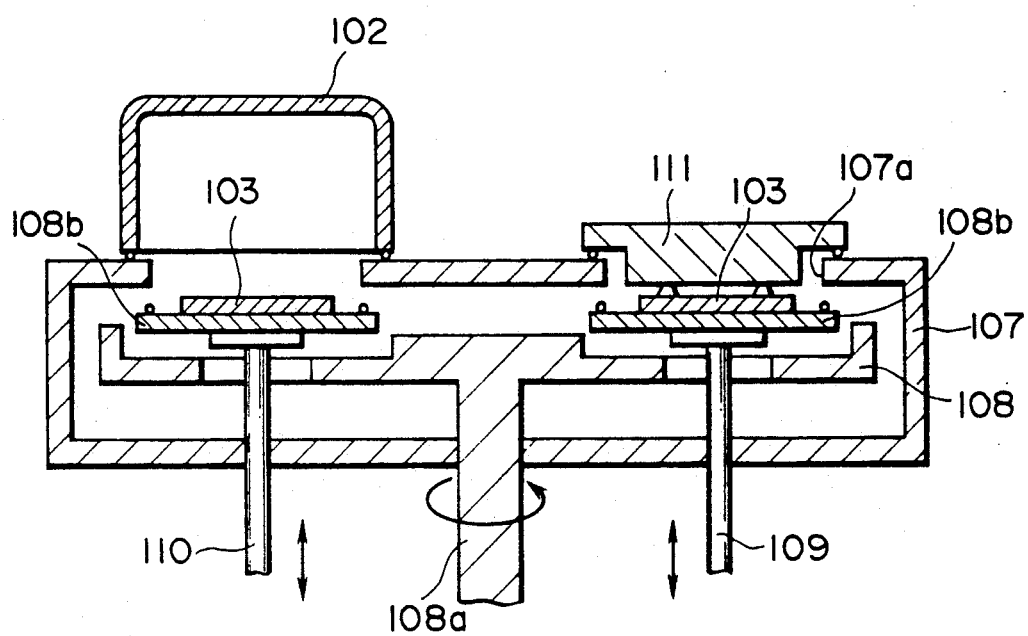

In distinction from the vacuum chamber 2 of the preceding embodiment, the vacuum chamber 21 is formed with a sector-shaped opening with an included angle of approximately 90°, as shown by an arrow 0 in FIG. 15, through which the rotary arm 22 is rotated, and a vacuum lid 21a having a disc inlet/outlet 3 and a disc processing opening 6 is mounted in position for closing the hollow interior. The capacity of the vacuum chamber 21 is significantly reduced because only one rotary arm 22 is used and the range of rotation of the rotary arm 22 determines the capacity. For example, the capacity is 5 liters, which is not more than one fifth that of the vacuum chamber having the rotary table a shown in FIGS. 27 and 28.

A duct 24 connected to a vacuum pump for exhausting the air from the vacuum chamber 21 is provided at the mid portion of the bottom of the vacuum chamber 21. Air exhaust is performed immediately after closure of the disc inlet/outlet 3 by the lid 5 at the time of introduction or exit of the disc base plate. Since the duct 24 is provided at the middle position of the vacuum chamber 21 which is not blocked by the rotary arm 22, the inside of the vacuum chamber 21 is exhausted instantaneously to a predetermined degree of vacuum. For example, the air exhaust may be completed in less than one second.

The rotary arm 22 is disc-shaped at the free end adapted for supporting the disc base plate, and is tapered toward its proximal end. The free end of the rotary arm 22 is formed with a positioning recess 22a into which fits a rest 13 adapted for securing a centering hole of the disc base plate for positioning and securing the disc base plate. The middle portion of the bottom of the recess 22a is formed with an inserting aperture 22b through which thrusting shafts 25 and 26 are passed for thrusting the rest 13 upwards.

The thrusting shafts 25, 26 are extended into the inside of the vacuum chamber 2 by means of through-holes, not shown, formed in the bottom of the vacuum chamber 21 for facing the inlet/outlet 3 and the processing opening 6. Disc-shaped thrusting members 25a and 26a for thrusting the rest 13 by way of the thrusting aperture 22b formed in the rotary arm 22 are attached to the distal ends of the thrusting shafts 25, 26.

The thrusting shafts 25, 26 are adapted for being reciprocated vertically by driving means provided with control means, not shown, as shown by an arrow K in FIG. 14. When the distal ends of the rotary arm 22 face the disc inlet/outlet 3 and the disc processing opening 6, the thrusting shafts 25, 26 are protruded by the driving device for bringing the thrusting members 25a and 26a into abutment with the bottom surfaces of the rests 13 by way of the inserting aperture 22b. When the thrusting shafts 25, 26 are thrusted further, the rests 13 are thereby shifted upwards until the rim of the upper surfaces of the rests 13 abuts the rim of the opening of the disc inlet/outlet 3 and that of the disc processing aperture 6. Since a sealing member 13b such as an O-ring is provided on the rim of the upper surface of each rest 13, an air-tight state may be kept in the inside of the vacuum chamber 21 and the sputtering station 4.

The components other than those described above are the same as those of the preceding embodiment and the description thereof is omitted for simplicity.

With the above described optical disc producing apparatus, since the transfer of the disc base plate between the disc inlet/outlet 3 and the disc processing opening 6 is performed by the sole rotary arm 22 over a smaller angle of rotation, the vacuum chamber 21 may be further reduced in size and capacity. The floor space may be reduced, and the vacuum pump may be reduced in size, so that the desired vacuum may be established instantaneously. Since only the sole rotary arm 22 is used, and the duct 24 is provided at a position not blocked by the arm 22, fluctuations in the vacuum degree within the vacuum chamber 21 may be eliminated.

The process of producing the optical disc by the above described apparatus is hereinafter explained.

Figure 16:
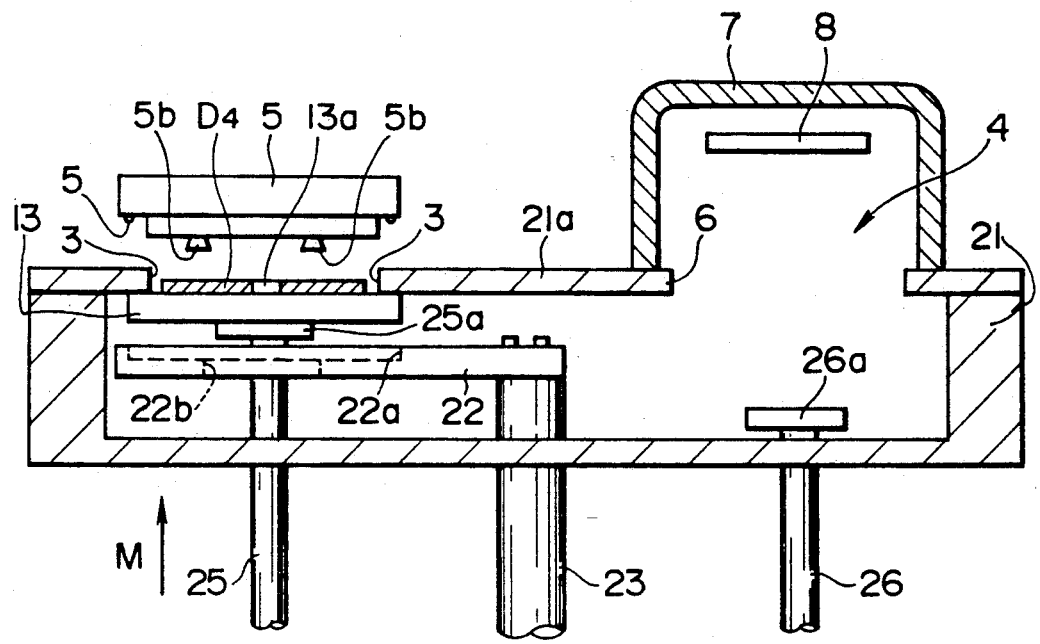
FIG. 16 is a longitudinal sectional view showing the state of charging of the disc base plate into the vacuum chamber of the modification of the optical disc producing apparatus.

First, as shown in FIG. 16, the thrusting shaft 25 provided for the disc inlet/outlet 3 is protruded as shown by an arrow M, thereby shifting the rest 13 now paced on the rotary arm 22 upwards for closing the disc inlet/outlet 3 by the rest 13. The lid 5 is moved upwardly away from the vacuum chamber 21 for facing the upper side of the rest 13 by way of the disc inlet/outlet 3. The disc base plate D4 is placed and positioned on the rest 13.

Figure 17:
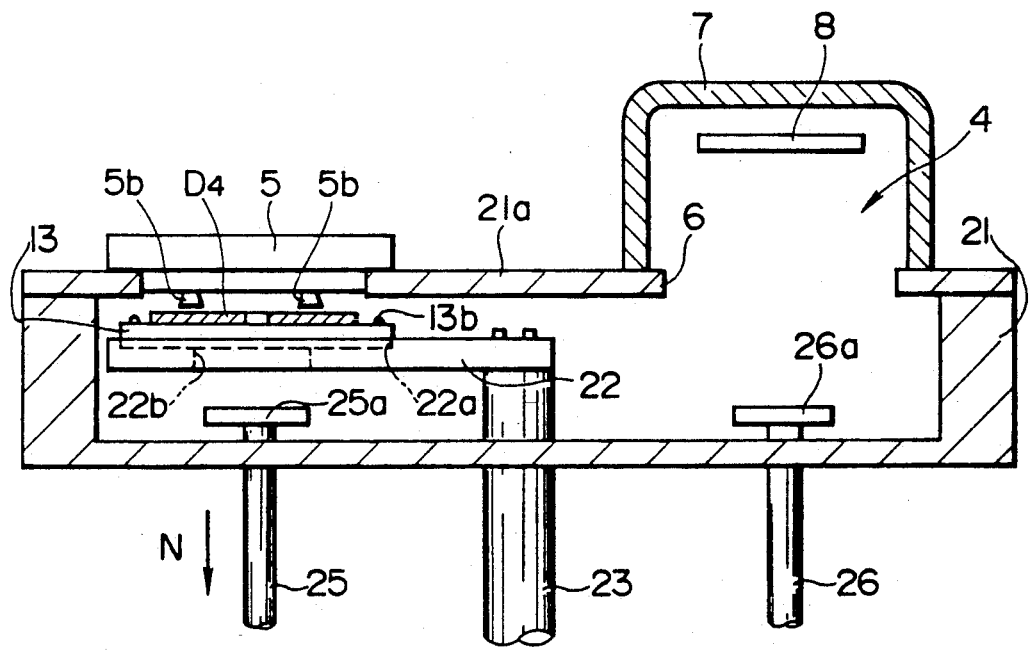
FIG. 17 is a longitudinal sectional view showing the state of completion of charging of the disc base plate into the vacuum chamber of the optical disc producing apparatus.

Then, as shown in FIG. 17, the lid 5 is moved down for closing the disc inlet/outlet 3, at the same time that the vacuum pump is actuated for maintaining the predetermined vacuum of the order of, for example, $5 \times 10^{-3}$ Torr within the vacuum chamber 21.

Since the vacuum chamber 21 of the present embodiment is significantly reduced in capacity, the desired degree of vacuum can be reached instantaneously. For example, the time until the desired vacuum is reached is not longer than one second.

The thrusting shaft 25 is then lowered, as shown by an arrow N, in FIG. 17, toward the side provided with the vacuum pump, thereby shifting the rest 1 down until the rest 13 is placed on the distal end of the rotary arm 22.

Figure 18:
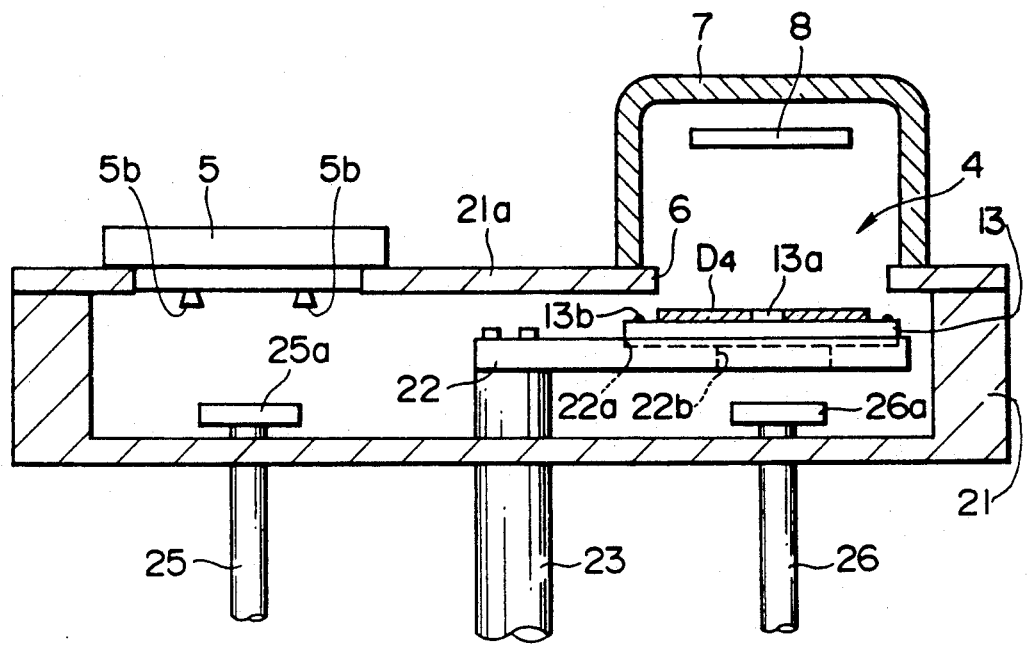
FIG. 18 is a longitudinal sectional view showing the state in which the disc base plate has been transferred to the sputtering station in the vacuum chamber of the optical disc producing apparatus.

When the rest 13 is placed on the distal end of the rotary arm 22, the arm 22 is rotated toward the sputtering station 4 as shown by an arrow $L_1$ in FIG. 15. The disc base plate $D_4$, placed on the rest 13, is positioned below the disc processing opening 6, as shown in FIG. 18.

When the rest 13 is positioned, the thrusting shaft 26 provided below the rest 13 is protruded as shown by an arrow 0 in FIG. 19 for shifting the rest 13 upwards for stopping the processing opening 6 by the rest 13. The disc base plate $D_4$ faces the sputtering station 4 by way of the processing opening 6.

The sputtering operation for the disc base plate $D_4$ is initiated. The operation comes to a close in, for example, only two seconds.

Figure 20:
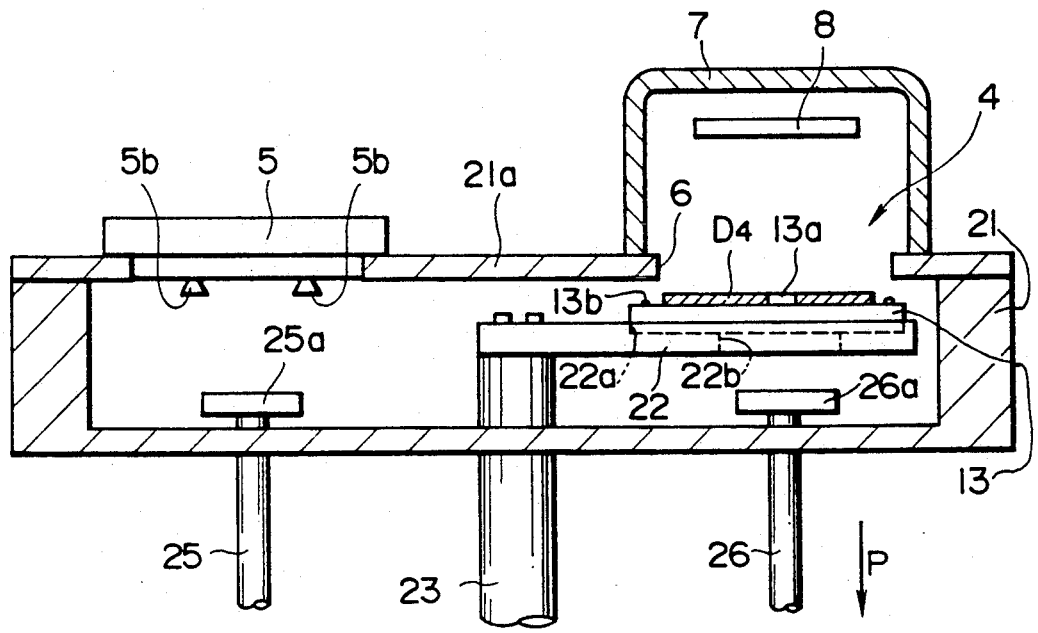
FIG. 20 is a longitudinal sectional view of the vacuum chamber of the optical disc producing apparatus showing the state of completion of the sputtering operation.

On completion of the sputtering operation, the thrusting shaft 26 is lowered toward the side provided with the vacuum pump, as shown by an arrow P in FIG. 20, until the rest 13 is placed on the distal end of the rotary arm 22.

Figure 21:
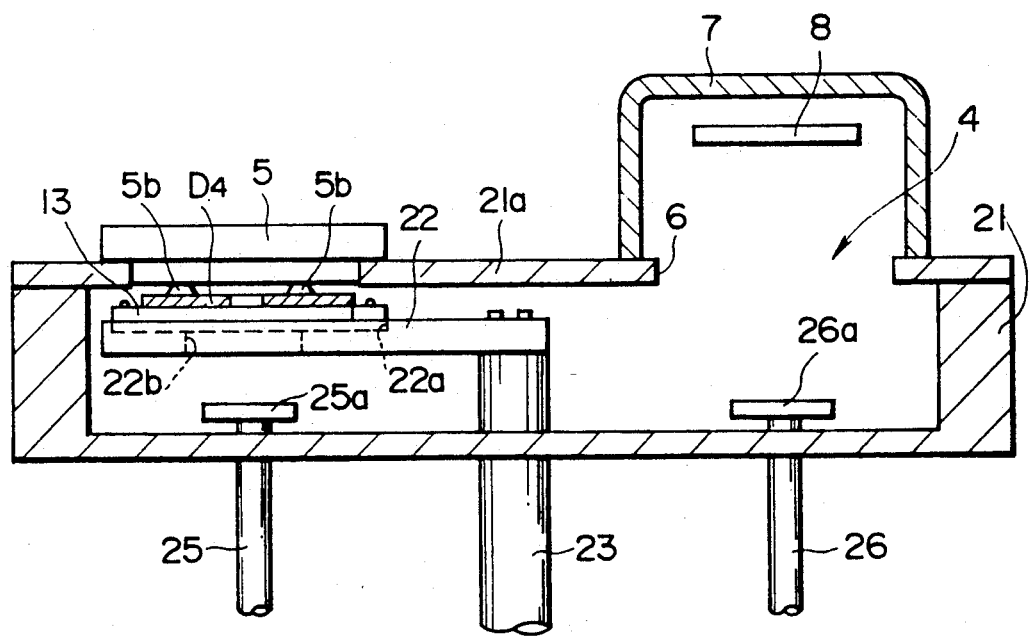
FIG. 21 is a longitudinal sectional view of the vacuum chamber of the optical disc producing apparatus showing the state of termination of disc base plate transfer to the disc inlet/outlet.

When the rest 13 is placed on the distal end of the rotary arm 22, the rotary arm 22 is rotated towards the disc inlet/outlet 3, as shown by an arrow $L_2$ in FIG. 15. The rest 13 supporting the disc base plate $D_4$, on which the thin aluminum film has been formed, is positioned below the disc inlet/outlet 3, as shown in FIG. 21.

Figure 22:
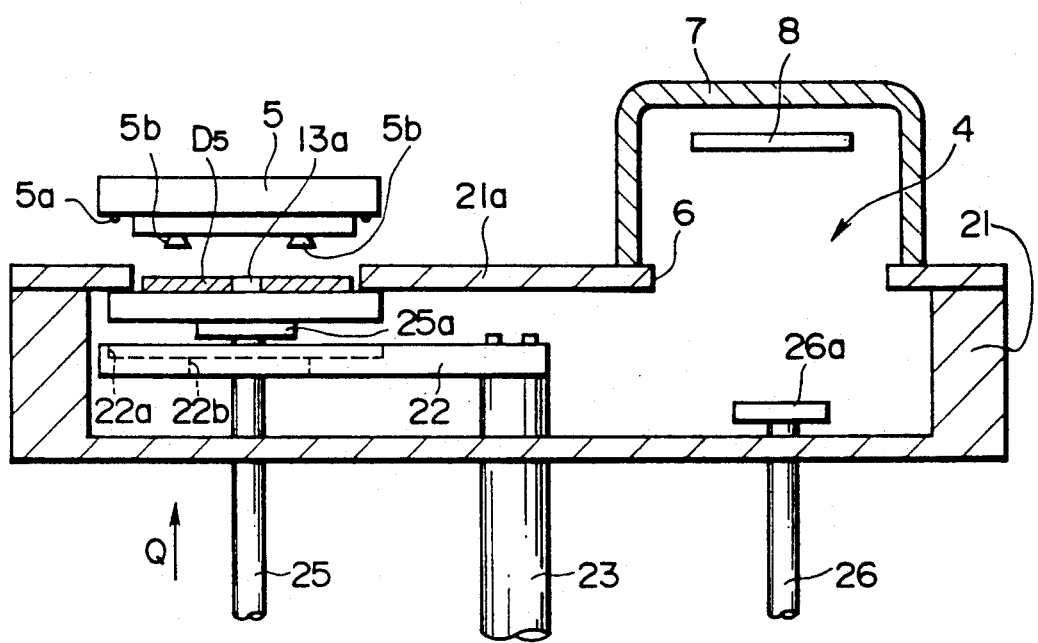
FIG. 22 is a longitudinal sectional view of the vacuum chamber of the optical disc producing apparatus showing the state of termination of disc base plate transfer to the disc inlet/outlet.

When the rests 13 are positioned in the prescribed manner, the thrusting shaft 25 is protruded, as shown by an arrow in FIG. 22, for shifting the rest 13 upwards for closing the disc inlet/outlet 3 by the rest 13.

The cover 5 is moved away from the vacuum chamber 21, and the disc base plate $D_4$, placed on the rest 13, is taken out of the vacuum chamber 21 via the disc inlet/outlet 3, while a new disc base plate $D_5$ is positioned on the upper surface of the rest The above described process is repeated sequentially for continuously sputtering disc base plates.

If the optical disc is produced using the optical disc producing apparatus of the present embodiment, since the vacuum chamber 21 is of an extremely small size, the time necessary for operations other than sputtering may be shortened for significantly reducing the cycle time elapsed between charging and exit of the disc base plate into or out of the apparatus. As a result, the production quantity per unit time and hence the production efficiency ma be increased significantly.

An embodiment of a sputtering system comprised of two or more juxtaposed optical disc producing apparatus according to any of the preceding embodiments for performing the random sputtering operation by taking advantage of the idle time during the sputtering operations in each of the optical disc producing apparatus, is hereinafter explained.

In the present embodiment, two of the optical disc producing apparatus according to the preceding second embodiment are arranged in juxtaposition.

Figure 23:
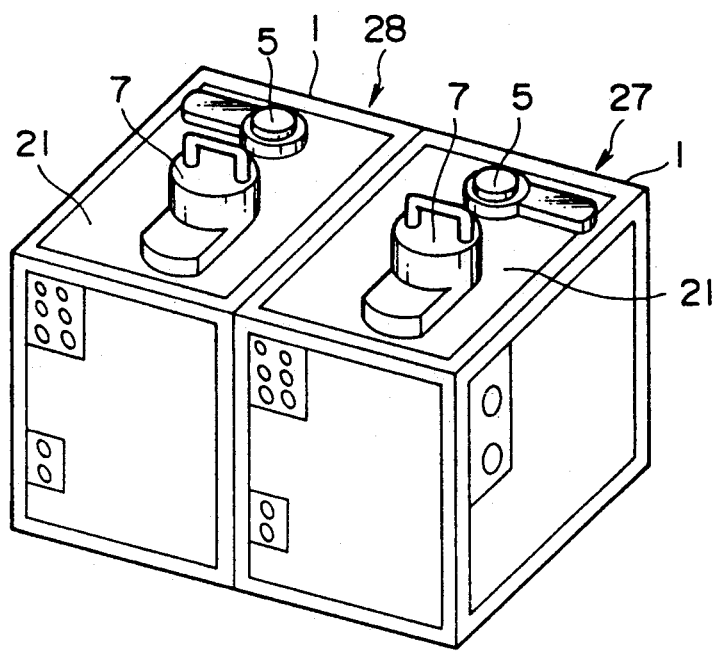
FIG. 23 is a perspective view showing an embodiment of the sputtering system according to the present invention.
Figure 24:
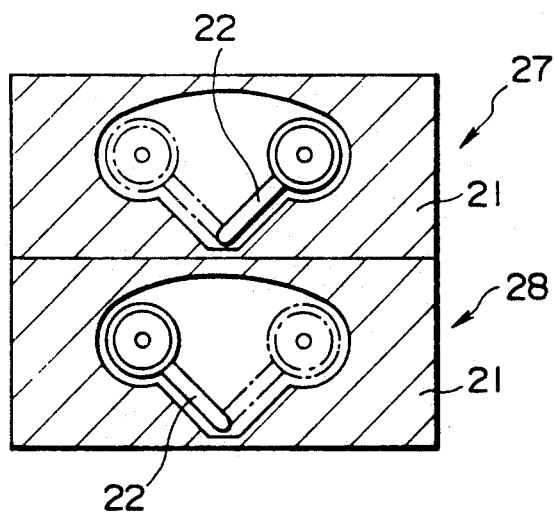
FIG. 24 is a transverse sectional view thereof.

That is, the sputtering system is constituted by two optical disc producing apparatus 27 and 28 juxtaposed to each other as shown in FIGS. 23 and 24 and, during the time interval following the end of sputtering and before the start of next sputtering in the apparatus 27, sputtering is performed in the other apparatus 28.

Figure 25A:
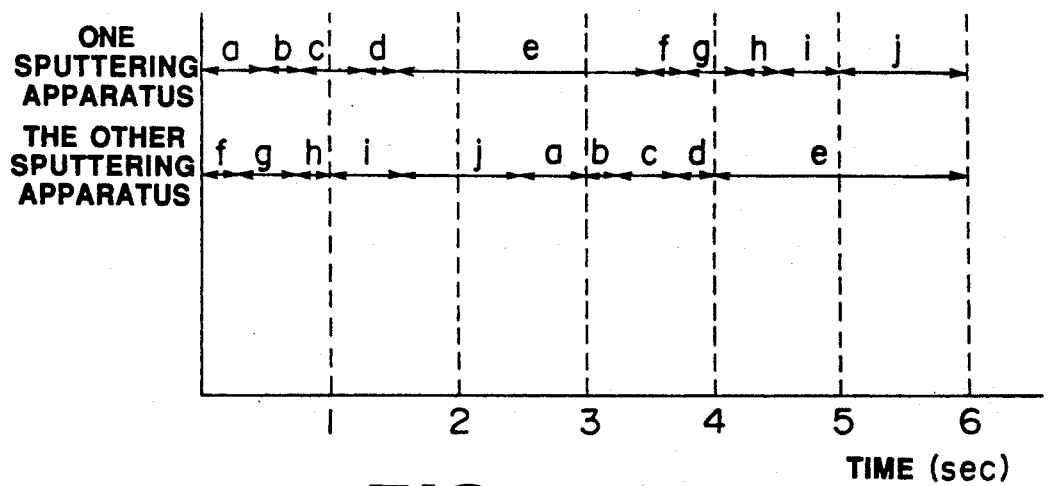
FIG. 25(a) is a timing chart showing a typical sequence of operations for sputtering by the sputtering system of the present invention.
Figure 25B:
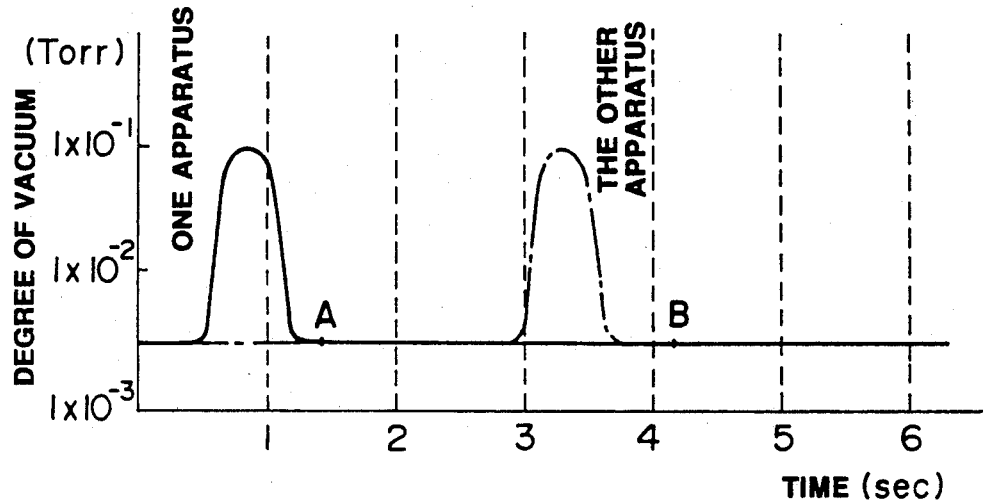
FIG. 25(b) is a timing chart illustrating the operating timing of a vacuum pump.

The operation is explained by referring to a timing chart shown in FIG. 25(a). In association with the timing chart, the degree of vacuum and the sputtering pass in each apparatus are shown in FIGS. 25(b) and (c), respectively.

First, in one of the apparatus, e.g. apparatus 27, the vacuum pump is actuated for establishing a predetermined degree of vacuum in the vacuum chamber 21 (see FIG. 17). This operation is performed within a time interval shown by an arrow a in FIG. 25(a).

The thrusting shaft 25 at the disc inlet/outlet 3 is then lowered towards the side provided with the vacuum pump and the rest 13 is placed on the distal end of the rotary arm 22 (see FIG. 17). This operation is performed within a time interval shown by an arrow b in FIG. 25a.

The rotary arm 22 is then rotated towards the sputtering station 4 and the disc base plate $D_4$ is placed below the disc processing opening 6 (see FIG. 18). This operation is performed within a time interval shown by an arrow c in FIG. 25a.

Figure 19:
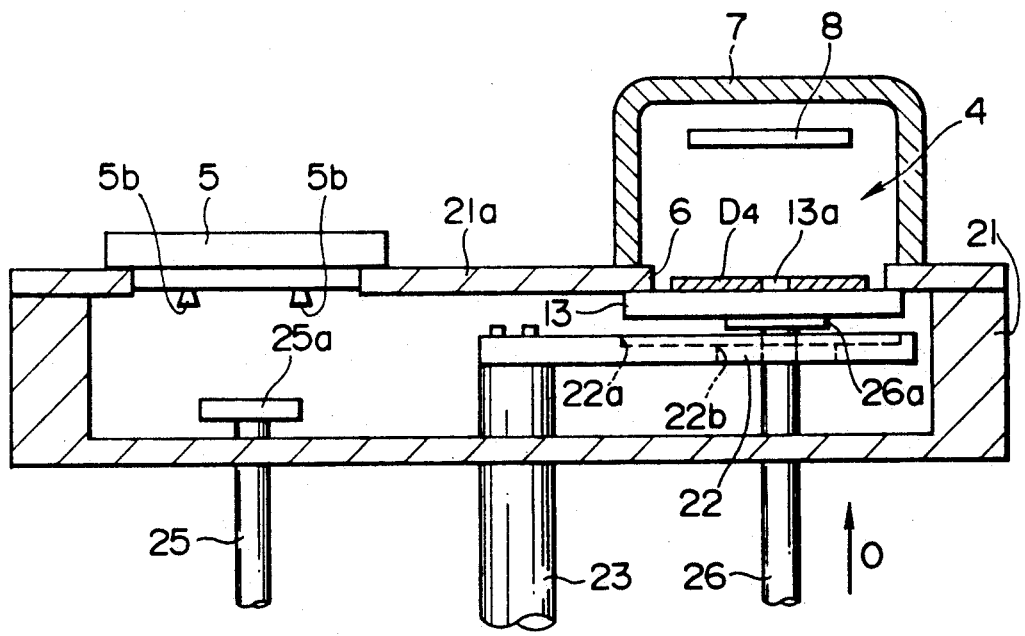
FIG. 19 is a longitudinal sectional view of the vacuum chamber of the optical disc producing apparatus showing the state of processing by sputtering of the disc base plate.
Figure 25C:
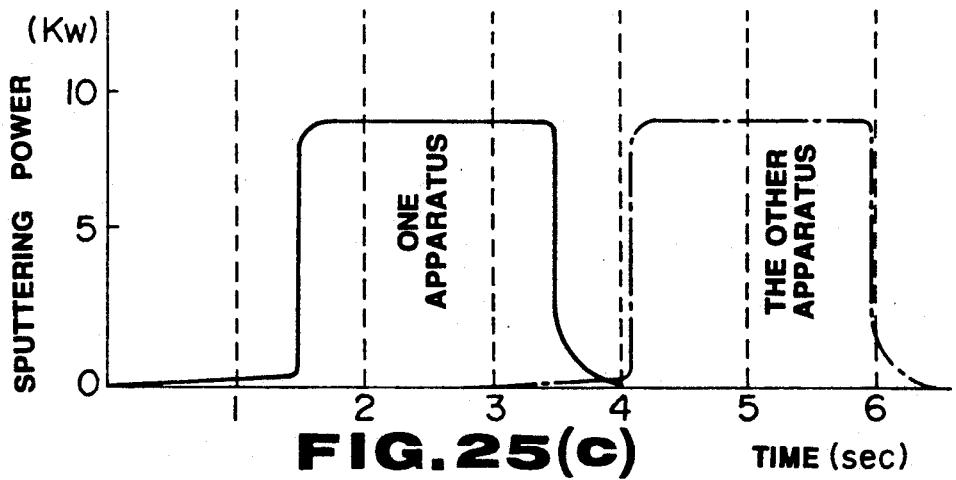
FIG. 25(c) is a timing chart illustrating the operating timing of the sputtering power source.
Figure 26:
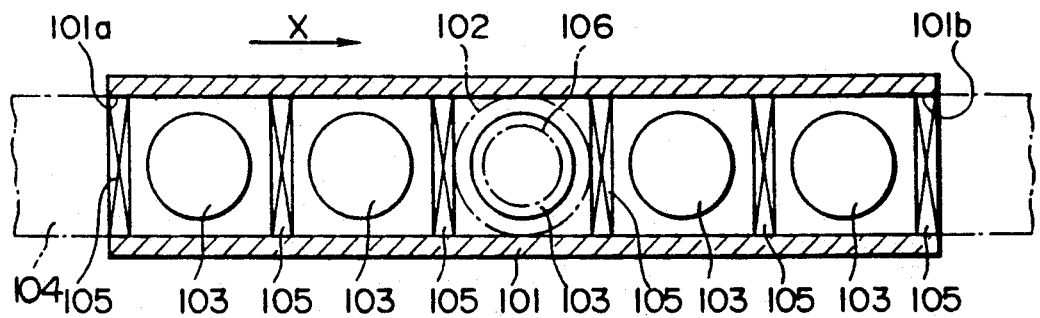
FIG. 26 is a transverse sectional view showing a conventional sputtering apparatus.

The thrusting shaft 26 on the side of the disc processing opening 6 is then protruded for shifting the rest 13 upwards for thereby closing the disc processing opening 6 (see FIG. 19). This operation is performed within a time interval shown by an arrow d in FIG. 25a. During this time interval, the time point at which the desired degree of vacuum is reached, that is the mid point A shown in FIG. 25b, is detected, and simultaneously, the sputtering power source is turned on, as shown in FIG. 25c, for maintaining a predetermined voltage.

The sputtering operation for the disc base plate $D_4$ is then performed on the disc base plate $D_4$ (see FIG. 19). This operation is performed within a time interval shown by an arrow e in FIG. 25(a). On completion of the sputtering operation, the sputtering power source is turned off to lower the voltage.

The thrusting shaft 26 on the side of the disc processing opening 6 is lowered toward the side provided with the vacuum pump and the rest 13 is placed at the distal side of the rotary arm 22 (see FIG. 22). This operation is performed within a time interval shown by an arrow f in FIG. 25(a).

The rotary arm 22 is then rotated toward the disc inlet/outlet 3 and the sputtered disc base plate $D_4$ is positioned below the disc inlet/outlet 3 (see FIG. 21). This operation is performed within a time interval shown by an arrow g in FIG. 25(a).

The thrusting shaft 25 on the side of the disc inlet/outlet 3 is then protruded for shifting the rest 13 upwards for thereby closing the disc inlet/outlet 3 (see FIG. 22). This operation is performed within a time interval shown by an arrow h in FIG. 25(a).

Finally, the lid 5 is moved away from the vacuum chamber 21, and the disc base plate $D_4$ is taken out of the vacuum chamber 21 (see FIG. 22). This operation is performed within a time interval shown by an arrow i in FIG. 25(a).

In the other apparatus 28, the above described operation is performed repeatedly, starting with the operation following the end of sputtering in the apparatus 27, that is, with the operation of shifting the thrusting shaft 26 on the side of the disc processing opening 6 toward the side provided with the vacuum pump and placing the rest 13 on the distal end of the rotary arm 22 (the operation shown by an arrow f in FIG. 25(a)).

In the apparatus 28, during the time following the end of the preceding sputtering and before the start of the next sputtering operation, the operation of preparing for sputtering is completed, that is, the time shown by the mid point B in FIG. 25(b) is detected and simultaneously the sputtering power source is turned on as shown in FIG. 25(c) to maintain the predetermined voltage. The sputtering operation is performed during this time.

In the present embodiment, the sputtering operation is performed during the time when the disc base plate $D_4$ sputtered by the apparatus 27 is transported to the disc inlet/outlet 3. However, since the sputtering operation in the apparatus 28 need only be performed during the time following the end of sputtering apparatus 27 and before the start of next sputtering, the sputtering operation in the apparatus 28 may be performed simultaneously with the end of the sputtering operation in the apparatus 27.

By performing the sputtering operation in a random manner by taking advantage of the idle time during sputtering operations by the apparatus 27 and 28, the devices common to the apparatus 27 and 28, such as the sputtering power source, may be used by both the apparatus as long as they are not used simultaneously by both the apparatus. In addition, with the above described arrangement, the apparatus 27 and 28 may be reduced further in size and production costs, while they may be driven separately from each other such that, even when one of the apparatus if in trouble or halted transiently for maintenance operations, production may be continued without interrupting the production line. By performing the sputtering operation by the two apparatus 27 and 28 placed in juxtaposition to each other, the production quantity per unit time may be increased significantly. For example, with the use of a sole apparatus, a cycle time of 6 seconds is necessitated since the disc base plate introduced at the disc inlet/outlet 3 remains in the apparatus until it is taken out, whilst a disc may be produced every 3 seconds by the present system.

Although two apparatus are used in juxtaposition in the present system, three, four or more apparatus may be placed in juxtaposition to perform sputtering on the disc base plates in a random manner, as long as the sputtering operation to be performed by one of the apparatus is not overlapped with that performed by some other apparatus. Besides, although the optical disc producing apparatus of the second embodiment are placed in juxtaposition, the optical disc producing apparatus of the first embodiment may also be arranged in juxtaposition with naturally similar effects.

With the sputtering apparatus according to the present invention, the material to be processed by sputtering is transported between an inlet and a sputtering station of a vacuum chamber by a rotary arm or rotary arms provided in the vacuum chamber so that the number of the disc base plates residing in the vacuum chamber corresponds to the number of rotary arms.

Therefore, by using several rotary arms, the capacity of the vacuum chamber as well as the size of the vacuum pump may be reduced to reduce the size of the apparatus. By using the rotary arm or arms as the transfer means for transporting the material to be processed by sputtering, the construction of the apparatus may be simplified, while the production and maintenance may be facilitated.

By producing the optical disc with the use of the sputtering apparatus, the production quantity per unit time may be increased with improvement in production efficiency.

With the sputtering system according to the present invention, since two or more apparatus, reduced in size in accordance with the present invention, are placed in juxtaposition, and the sputtering operation is performed in one of the apparatus during the time following the end of the sputtering and before the start of next sputtering in the other apparatus, the equipment common to the apparatus may be used to reduce the production costs of the system. The production quantity per unit time may be increased by several times over that when a sole apparatus is used, with consequent further improvement in production efficiency.

Also, with the sputtering system according to the present invention, the respective apparatus may be driven independently, so that, even when the operation of one of the apparatus ceases due to the malfunction or for maintenance, the remaining apparatus may remain in operation for realizing an efficient backup system.

What is claimed is:

1. A sputtering apparatus comprising:
    a vacuum chamber having an opening for entrance and exit of a workpiece to be processed by sputtering and a processing section including a sputtering station,
    a first rotary arm provided in said vacuum chamber and including a first rest on the free end of the first rotary arm, said first rest being adapted for supporting the workpiece, and an additional rotary arm provided at a predetermined distance apart from the first rotary arm in the rotational direction in the vacuum chamber, said additional rotary arm having a second rest on the free end of the additional rotary arm;
    transfer means for transferring said workpiece between said opening and said processing section by the rotational movement of said first and said additional rotary arms while the opening is closed by either said first or said second rest;
    first lift means for raising or lowering either said first or said second rest in said opening and second lift means for raising or lowering said first or second rest in said sputtering station; and
    means for rotating said first rotary arm and said additional rotary arm so that, when one of the first rotary arm and the additional rotary arm is at said opening in said vacuum chamber, the other of the first rotary arm and the additional rotary arm is transferring said workpiece to the processing station.

2. The sputter apparatus according to claim 1, characterized in that said first and said second rests are provided removably on said first rotary arm and said additional rotary arm, respectively.

3. The sputtering apparatus according to claim 2, wherein each of said first and second rests is adapted for closing said opening in said vacuum chamber and a processing opening in said sputtering station when said first and second rests are each raised by a respective one of said first and second lift means.

4. The sputtering apparatus according to claim 3, further including means for processing said workpiece by sputtering whilst the processing opening in said sputtering station is closed by one of said first and second rests.

5. The sputtering apparatus according to claim 1, wherein both said rotary arms are mounted on the same axis.

6. A sputtering system comprising two or more juxtaposed sputtering apparatus, each of said apparatus controlled by a common mean and including a vacuum chamber having an opening for entrance and exit of a workpiece to be processed by sputtering, and a processing section including a sputtering station, at least one rotary arm provided in said vacuum chamber and having a rest on a free end of the rotary arm, said rest being adapted for supporting the workpiece, and transfer means for transferring said workpiece between said opening in said vacuum chamber and said processing section by rotation movement of said rotary arm, and means for performing a sputtering operation by one of said apparatus while remaining apparatus are not performing a sputtering operation.

7. The sputtering system according to claim 6 wherein the sputtering operation is performed by one of the apparatus during the time when the sputtering operation is completed and the next sputtering operation is not started at the remaining sputtering apparatus.

8. The sputtering system according to claim 7 wherein the sputtering operation is performed by one of the apparatus during the time when the material processed by sputtering by one of the apparatus is transported to said opening.

* * * * *